United States Patent
Platzgummer

(10) Patent No.: US 7,598,499 B2
(45) Date of Patent: Oct. 6, 2009

(54) CHARGED-PARTICLE EXPOSURE APPARATUS

(75) Inventor: Elmar Platzgummer, Vienna (AT)

(73) Assignee: IMS Nanofabrications AG, Vienna (AT)

( * ) Notice: Subject to any disclaimer, the term of this patent is extended or adjusted under 35 U.S.C. 154(b) by 130 days.

(21) Appl. No.: 11/978,661

(22) Filed: Oct. 30, 2007

(65) Prior Publication Data
US 2008/0099693 A1 May 1, 2008

(30) Foreign Application Priority Data
Oct. 30, 2006 (AT) .................. 1822/2006

(51) Int. Cl.
*G01K 1/08* (2006.01)
*H01J 3/14* (2006.01)
*H01J 3/26* (2006.01)

(52) U.S. Cl. ............. 250/398; 250/492.22; 250/492.21; 250/492.1; 250/492.2; 250/492.23; 250/307; 250/396 R; 250/453.11; 250/281; 250/298; 369/43; 369/101; 369/53.28

(58) Field of Classification Search ................. 250/398, 250/492.22, 492.21, 492.1, 492.2, 492.23, 250/307, 396 R, 453.11, 281, 298; 369/43, 369/101, 53.28
See application file for complete search history.

(56) References Cited

U.S. PATENT DOCUMENTS

| | | | | |
|---|---|---|---|---|
| 3,624,391 | A * | 11/1971 | Davison ................. 250/453.11 |
| 4,985,634 | A | 1/1991 | Stengl et al. |
| 6,232,040 | B1 | 5/2001 | Katsap et al. |
| 6,768,125 | B2 | 7/2004 | Platzgummer |
| 7,214,951 | B2 | 5/2007 | Stengl et al. |
| 2008/0230711 | A1 * | 9/2008 | Platzgummer et al. .. 250/396 R |
| 2008/0258084 | A1 * | 10/2008 | Platzgummer et al. . 250/492.21 |
| 2009/0026389 | A1 * | 1/2009 | Platzgummer ........... 250/492.2 |

FOREIGN PATENT DOCUMENTS

EP 0312653 A1 * 10/1987
WO WO 2006/086815 A2 * 8/2006

OTHER PUBLICATIONS

Dougal, Roger A. et al., "High performance micropane electron beam window", J. Vac. Sci. Technol. B 18(6), Nov./Dec. 2000 [pp. 2750-2756].

Hudek, Peter et al., "Exposure optimization in high-resolution e-beam lithography", Microelectronic Engineering 83 (2006) 780-783.

* cited by examiner

*Primary Examiner*—David A Vanore
*Assistant Examiner*—Meenakshi S Sahu
(74) *Attorney, Agent, or Firm*—Davidson Berquist Jackson & Gowdey LLP

(57) ABSTRACT

In a particle-beam projection processing apparatus a target (41) is irradiated by means of a beam (pb) of energetic electrically charged particles, using a projection system (103) to image a pattern presented in a pattern definition means (102) onto the target (41) held at position by means of a target stage; no elements—other than the target itself—obstruct the path of the beam after the optical elements of the projection system. In order to reduce contaminations from the target space into the projection system, a protective diaphragm (15) is provided between the projection system and the target stage, having a central aperture surrounding the path of the patterned beam, wherein at least the portions of the diaphragm defining the central aperture are located within a field-free space after the projection system (103).

14 Claims, 5 Drawing Sheets

CHARGED-PARTICLE EXPOSURE APPARATUS

FIELD OF THE INVENTION AND DESCRIPTION OF PRIOR ART

The invention relates to improvements on particle-beam projection processing apparatus for irradiating a target by means of a beam of energetic electrically charged particles, comprising an illumination system, a pattern definition (PD) means and a projection system in order to project the beam patterned by the PD means onto a target positioned after the projection system. The illumination system serves to generate and form the energetic particles into a wide-area illuminating beam which, preferably, is substantially tele/homocentric at the location of the PD means and whose diameter is greater by at least one order of magnitude than the length of the tele/homocentricity region of the illuminating beam; the PD means, located after the illumination system as seen along the direction of the beam (i.e., downstream), positions an aperture pattern composed of apertures transparent to the energetic particles in the path of the illuminating beam, thus forming a patterned beam emerging from the aperture pattern; and the projection system, positioned after the pattern definition means, projects the patterned beam as mentioned.

One important application of processing apparatus of this kind is in the field of particle-beam lithography used in semiconductor technology, as a lithography apparatus, wherein, in order to define a desired pattern on a substrate surface, the wafer is covered with a layer of a radiation-sensitive photoresist, a desired structure is imaged onto the photoresist by means of a lithography apparatus which is then patterned by partial removal according to the pattern defined by the previous exposure step and then used as a mask for further structuring processes such as etching. Another important application of processing apparatus of this kind is in the field of nano-scale patterning, by direct ion beam material modification or ion beam induced etching and/or deposition, used for the fabrication or functionalization of nano-scale devices, particularly having sub-100 nm feature sizes.

The IMS-concept PLM2 (short for "Projection Mask-Less Lithography") as described in the U.S. Pat. No. 6,768,125 realizes a multi-beam direct write concept and uses a programmable aperture plate system (APS) as PD device for structuring an electron beam, which is extracted from a single electron source. At the APS the kinetic energy of the electrons is 5 keV. After the APS the electrons are accelerated to 100 keV and the image of the APS is reduced 200 times and projected onto the substrate.

In a particle optical system, particles (electrons or ions) scattered from a surface, such as the lenses and/or the APS and/or the substrate, may produce broadband energetic scattered particles (electrons or ions). Particularly the low-energetic particles (electrons or ions) and related secondary electron emission may cause chemical processes by which atoms or molecules adsorbed from the residual gas are deposited on the surface. This is why for example in presence of organic contamination in the vacuum irradiation may lead to material deposition which often forms insulating layers which are highly undesired in the charged optical system. Also residual gas atoms ionized due to either the beam or large electrostatic fields may be produced. A major source of secondary electrons and ions and scattered products is the target itself. These particles may contaminate the electron-optical systems (in particular the final lenses, but also the APS) and may even irradiate the wafer indirectly, thus forming a background dose which reduces the contrast of the image or causes CD variation (here, CD means critical dimension). In the following, indirect irradiation is referred to as particle fogging, caused by a broad energy band of electrons or ions that are scattered or re-scattered, for example by the lower surface of the objective lens (and/or from the stages, metrology systems or beam diagnosis devices located near the beam). Re-scattering means that the particles have been scattered at least one time before, for example when impinging on beam absorbing elements or the substrate. The particle fogging effect produces an additional parasitic exposure which is non-local. Depending on the distance between the substrate and the lower surface of the objective lens the lateral range of fogging can be in the range of centimeters. In order to meet the stringent CD uniformity requirements in electron beam lithography and compensate for this additional dose, very intensive calculations have to made using adequate software tools (cf. P. Hudek, D. Beyer, Microel. Eng. 83 (2006), 780).

The particles may further be accelerated into the column, whereas mainly the PD system is sensitive to contamination and, as a consequence, might be affected by local charging effects. The APS can be practically used under high or ultra high vacuum conditions only, otherwise the apertures would accrete due to beam induced deposition of organical material. However, the required high vacuum stage is a major technical issue and cost factor of an overall lithography system like the PML2. It is of enormous importance for a particle-optical system like the PML2 to keep the APS (the PD device) under high or ultra high vacuum conditions. Additionally, an important concern in the semiconductor fabrication environment is connected with the danger of mutual contamination and associated system failure, which could be due to a break down of parts of the aperture plates or electron source. The acceptability of an apparatus for a semiconductor fabrication line is strongly dependent on the reliability of the system with respect to particle purity and the risk of failure during operation.

In WO 2006/086815, the applicant (assignee) proposes using an additional foil electrode in the region of the beam after the PD system, namely, an electrically conductive foil located across the path of the patterned beam at a location between the pattern definition means and the position of the target close to an image of the aperture pattern formed by the projection system. The image may be the final image (produced on the target) or an intermediate image. It is evident that such a foil forms an effective barrier against contaminants such as gas products or secondary radiation; however, the foil may also represent a severe impediment for the imaging beam itself whose intensity will have to be raised accordingly.

U.S. Pat. No. 3,624,391 (Walden) discloses an electron beam irradiation apparatus with an evacuated chamber from which an electron beam emerges through a window with a pressure tight membrane; after that first membrane a second window membrane is provided so a cooling gas stream can pass between the two membrane. The second membrane need not be impermeable to the gas of the cooling gas stream, but is sufficient to prevent the gas flow to affect the surface of a material to be irradiated and positioned after the second window membrane.

It is an objective of the present invention to provide a way to restrict contaminants and secondary radiation (that may emerge from the target upon irradiation) from reaching the particle-optic elements of the projection system and/or the substrate while not impeding the propagation of the patterned beam.

SUMMARY OF THE INVENTION

This objective is achieved by a particle-beam projection apparatus for processing a target by irradiating it with a particle beam as described in the beginning where the projection system comprises a number of optical elements for shaping an electrical or electromagnetic field into at least one particle-optical lens, each of said optical elements having a central opening surrounding the path of the patterned beam, where the apparatus further comprises a first diaphragm located between the projection system and the target stage means and having a central aperture surrounding the path of the patterned beam, so the target is the first object (seen downstream) to obstruct the path of the patterned beam after the last optical element of the projection system, and wherein at least the portions of the first diaphragm defining the central aperture are located within the field-free space which is located after the projection system and within which the final image is formed. In the context of this invention, the term field-free space is used for a region where no electrostatic or electromagnetic fields are present that would contribute to the charged particle electro-optical lenses.

This diaphragm, which hereinafter is referred to as protective diaphragm, serves to avoid contamination, in particular back contamination, of the optical system from the substrate, which may come about by processes such as scattering or re-deposition, due to the distinct reduction of area through which such contaminants could propagate backwards from the target space into the space within the optical column. Notably, electrodes being under high voltage and providing high electrostatic field strength as well as delicate circuitry (such as that of the APS) are sensitive to such contaminants. Preferably, the width (double radius) of the aperture in the diaphragm is only a little larger than the diameter of the patterned beam, i.e., the final image formed on the target by the telecentrical beam. For instance, the diaphragm width may be 50 µm for a beam diameter of 25 µm, thus allowing beam placement correction or scanning range in the range of 25 µm. The thickness of the protective diaphragm is typically 5-10 times smaller than the width of the central aperture in it. The advantage of a membrane-like structure is that side wall effects such as charging or particle scattering are minimized.

Furthermore, the protective diaphragm may serve as an additional separation means between the target space and the optical column which may be pumped differentially.

In one advantageous development of the invention, the central aperture is adapted to laterally delimit the patterned beam. This serves to limit the lateral distribution of particles re-scattered from the target; such particles are limited by the inner diameter of the central aperture in the protective diaphragm.

Preferably, the aperture of the first diaphragm has a width at least 5 times smaller than the width of the central opening of the last optical element of the projection system.

To further inhibit the propagation of particles into the optical column, the projection system may further comprise a second diaphragm which has a central aperture surrounding the patterned beam and is positioned at a location before an optical element of the projection system. In this case, the central aperture of the second diaphragm may suitably have a width smaller than the width of the central opening of said optical element.

In the case that the projection system is designed to project the patterned beam through a cross-over, it is a suitable choice to locate the second diaphragm at a position where it surrounds the patterned beam at or close to the cross-over.

Furthermore, the first diaphragm may be a component of a housing means adapted to define a space around a location where the beam impinges upon the target and separate said space from the surrounding space and where the housing means further comprises a pumping line for evacuation of said space. This is helpful to define separate gas conditions around the target and/or the place of beam impingement, in particular if the housing means may further comprise a gas inlet nozzle for directing gas, such as a process gas, towards the location where the beam impinges upon the target.

In general, the projections system may comprise electrostatic and/or electromagnetic components to form particle-optical lenses. In a specific case, the projection system may be an electro-optical system, comprising a number of electro-optical elements (of electrostatic character) for shaping an electrical field into an electro-optical lens.

The first diaphragm may be laterally relocatable so it can be mounted at various positions differing only by lateral shifts perpendicular to the direction of the beam.

In the case that a beam configuration composed of a multitude of beamlets (like, e.g., in the PML2 configuration) is used, the central aperture may be composed of a multitude of apertures arranged in an array. In this case, the width of the central aperture is constituted by the total width of said array.

One special development of the invention realizes a partially transmissive membrane located around the central aperture, by surrounding it with a membrane portion of a thickness not greater than the width of the central aperture. In this case, the membrane portion may preferably be transparent for impinging particles having a kinetic energy smaller than a threshold energy which in turn is below the kinetic energy of the particles of the beam when they are passing through the central aperture. By this measure, low energy particles emitted from the substrate are absorbed by the partially transmissive membrane whereas energetic particles (i.e., at energies of the beam itself) are transmitted.

In order to ensure a well-defined field-free space after the last optical element of the projection system, it is suitable to have the width of the central opening of the last optical element of the projection system being smaller than one quarter of the distance of said last optical element to the final image.

BRIEF DESCRIPTION OF THE DRAWINGS

In the following, the present invention is described in more detail with reference to the drawings.

DETAILED DESCRIPTION OF THE INVENTION

The preferred embodiment of the invention discussed in the following is based on the PML2-type particle-beam exposure apparatus with a pattern definition (PD) system as disclosed in the U.S. Pat. No. 6,768,125 (=GB 2 389 454 A) of the applicant (assignee), and with a large-reduction projecting system. In the following, first the technical background of the apparatus is discussed as far as relevant to the invention, then embodiments of the invention are discussed in detail. It should be appreciated that the invention is not restricted to the following embodiments nor the PD system, which merely represent one of the possible implementations of the invention; rather, the invention is suitable for other types of processing systems that employ a particle-beam with projection stages as well.

PML2 System

Figure 1:
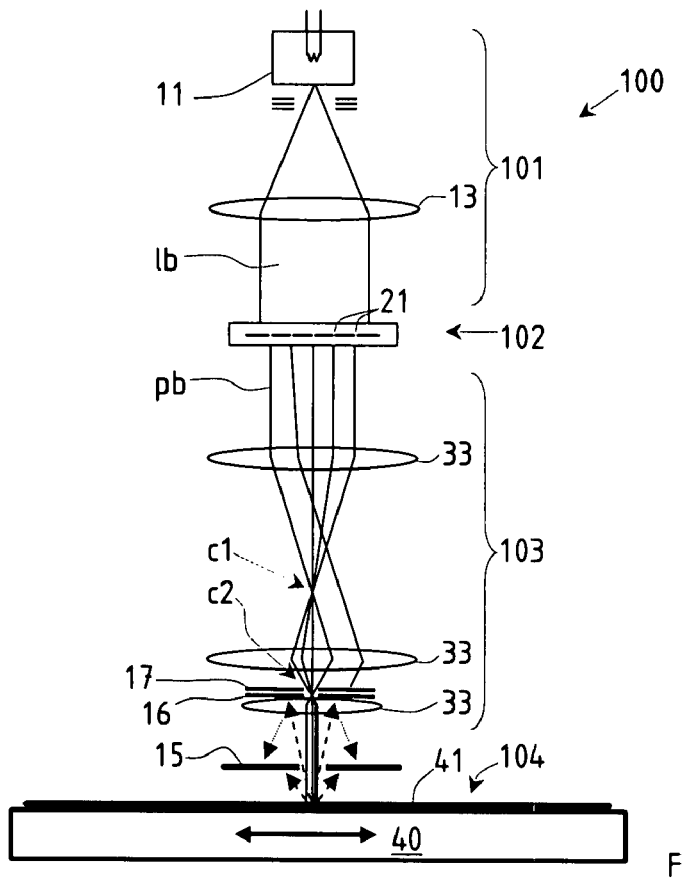
FIG. 1 shows a schematic overview of a particle-beam exposure apparatus incorporating a protective diaphragm according to the invention.

A schematic overview of a maskless particle-beam exposure apparatus PML2 employing the invention is shown in FIG. 1. In the following, only those details are given as needed to disclose the invention; for the sake of clarity, the components are not shown to size in FIG. 1, particularly the lateral width of the particle beam is exaggerated. For more details, the reader is referred to the U.S. Pat. No. 6,768,125.

As already mentioned, an electron beam generated by an illumination system is used in the PML2 system. It illuminates a PD means having a regular array of apertures in order to define a beam pattern to be projected on a target surface. With each aperture, a small beam is defined, and the passage of each beam through an aperture can be controlled so as to allow ('switch on') or effectively deactivate ('switch off') the passage of particles of the beam through the respective apertures towards the target. The beam permeating the aperture array (or more exactly, through the switched-on apertures of the array) forms a patterned particle beam bearing a pattern information as represented by the spatial arrangement of the apertures. The patterned beam is then projected by means of a particle-optical projection system onto the target (for instance, a semiconductor substrate) where an image of the apertures is thus formed to modify the target at the irradiated portions. The image formed by the beam is moved continuously along a straight path over each die field; additional scanning of the beam in a direction perpendicular to the scanning direction is not necessary (except, where needed, to compensate for lateral travel motion errors of the scanning stage).

The main components of the apparatus 100 are—corresponding to the direction of the lithography beam lb, pb which in this example runs vertically downward in FIG. 1—an illumination system 101, a PD system 102, a projecting system 103, and a target station 104 with the target or substrate 41. The particle-optical systems 101, 103 are realized using electrostatic or electromagnetic lenses. The electro-optical parts 101,102,103 of the apparatus 100 are contained in a vacuum housing (not shown) held at high vacuum to ensure an unimpeded propagation of the beam lb, pb along the optical axis cx of the apparatus.

The illumination system 101 comprises, for instance, an electron source 11 and a condenser lens system 13. It should, however, be noted that in place of electrons, in general, other electrically charged particles can be used as well. Apart from electrons (emitted from an electron gun) these can be, for instance, hydrogen ions or heavy ions; in the context of this disclosure heavy ions refer to ions of elements heavier than C, such as O, N, or the noble gases Ne, Ar, Kr, Xe.

The electron source 11 (in principle also ions are possible) emits energetic electrons, i.e., having a defined (kinetic) energy of typically several keV (e.g. 5 keV at the PD system 102) with a comparatively small energy spread of, e.g., $\Delta E=1$ eV. By means of an electro-optical condenser lens system 13, the electrons emitted from the source 11 are formed into a wide-area, substantially telecentric electron beam serving as lithography beam lb. The telecentricity of the beam is within a range of ±25 μrad deviation from the optical axis at the position of the PD device, resulting in a telecentricity range of ±5 μrad deviation from the optical axis at the position of the substrate, assuming here a 200× reduction system and equal particle energies at PD device and substrate.

The lithography beam lb then irradiates a PD device which, together with the devices needed to keep its position, form the PD system 102. The PD device is held at a specific position in the path of the lithography beam lb, which thus irradiates an aperture pattern formed by a plurality of apertures 21. As already mentioned, each of the apertures can be "switched on" or "open" so as to allow the beamlet passing through the respective aperture to reach the target (it is then said, the aperture is transparent to the incident beam); otherwise, the aperture is "switched off" or "closed", in which case the beam path of the respective beamlet is affected in a way that it will be absorbed or otherwise removed out of the beam path before it can reach the target (thus, the aperture is effectively non-transparent or opaque to the beam). The pattern of switched-on apertures is chosen according to the pattern to be exposed on the substrate, as these apertures are the only portions of the PD device transparent to the beam lb, which is thus formed into a patterned beam pb emerging from the apertures (i.e., in FIG. 1, below the PD system 102). For details about the architecture and operation of the PD device, and in particular the architecture of its blanking plate, the reader is referred to the U.S. Pat. No. 6,768,125. In FIG. 1 only five beamlets are shown in the patterned beam pb, of which the second beamlet from the left is switched off as it is absorbed on an absorbing plate 17; the other, switched-on beamlets pass through a central opening of the plate 17 and thus are projected onto the target.

The pattern as represented by the patterned beam pb is then projected by means of an electro-optical projection system 103 onto the substrate 41 where it forms an image of the switched-on mask apertures. The projection system 103 implements a demagnification of, for instance, 200×. The substrate 41 is, for instance, a silicon wafer covered with a photo-resist layer. The wafer 41 is held and positioned by a wafer stage 40 of the target station 104.

In the embodiment of the invention shown in FIG. 1, the projection system 103 is composed of two consecutive electro-optical projector stages with a crossover c1, c2, respectively. The electrostatic lenses 33 used to realize the projectors are shown in FIG. 1 in symbolic form only as technical realizations of electrostatic imaging systems are well known in the prior art, such as, for instance, the U.S. Pat. No. 4,985,634 (=EP 0 344 646) of the applicant. The first projector stage images the plane of the apertures of the PD device to an intermediate image which in turn is imaged onto the substrate surface by means of the second projector stage. Both stages employ a demagnifying imaging through crossovers c1,c2; thus, while the intermediate image is inverted, the final image produced on the substrate is upright (non-inverted). The demagnification factor is about 14× for both stages, resulting in an overall demagnification of 200×. A demagnification of this order is in particular suitable with a lithography setup, in order to elevate problems of miniaturization in the PD device.

As a means to introduce a small lateral shift to the image, i.e. along a direction perpendicular to the optical axis cx by an amount not larger than the lateral width of the beam bp itself, deflection means (not shown) may be provided in one or both of the projector stages. Such deflection means can be realized as, for instance, a multipole electrode system; as discussed in the U.S. Pat. No. 6,768,125; additionally, a magnetic coil may be used to generate a rotation of the pattern in the substrate plane where needed. The electro-optical lenses are mainly composed of electrostatic electrodes, but magnetic lenses may also be used.

By controlling the pattern formed in the PD system 102, an arbitrary beam pattern can be generated and transferred to a substrate. Suitably, a scanning stripe exposure strategy, where the substrate is moved under the incident beam, is utilized so a beam-scanning strategy is not required, where the position of the beam is perpetually changed and thus the beam is effectively scanned over the (more or less resting) target surface like in case of a single focused beam system.

Protective Diaphragm

Referring again to FIG. 1, a diaphragm means 15, hereinafter also referred to as "Protective Diaphragm", is provided in the field-free space after the optical column and in front of the target space. The Protective Diaphragm 15 thus divides a space over the target ('target space') from the optical system, and it has a narrow aperture whose opening diameter is in the order of the beam dimension at the substrate position. The Protective Diaphragm diameter is suitably chosen as small as possible so as to exclude back-scattered and secondary particles (short broken arrows in FIG. 1) from reaching the side wall and as much of the electrodes as possible. It is due to the fact that the position of the beam varies only little and is almost fixed with respect to the optical column that a provision of a Protective Diaphragm 15 according to the invention is viable.

Figure 2:
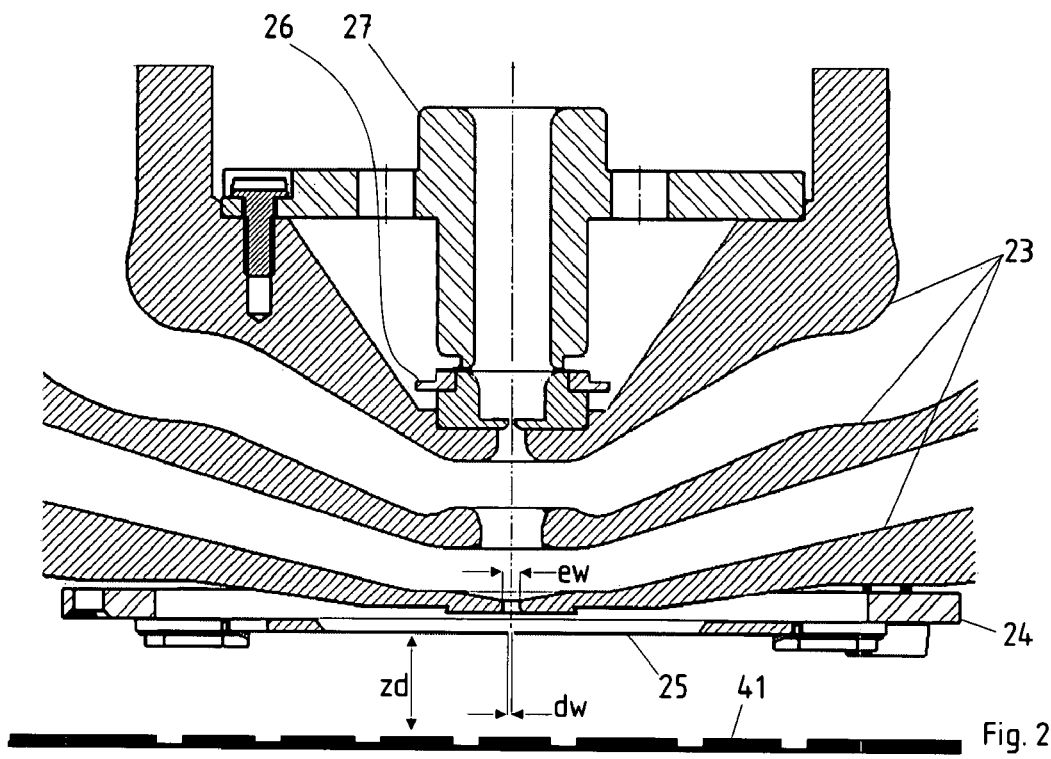
FIG. 2 shows a protective diaphragm according to a first embodiment.

FIG. 2 shows a longitudinal-sectional detail of a Protective Diaphragm 25 and its geometrical arrangement below the electrodes 23 of the last electro-optical lens. The protective diaphragm is mounted on a mounting ring 24 and can be replaced easily as a removable waste part.

Figure 6A:
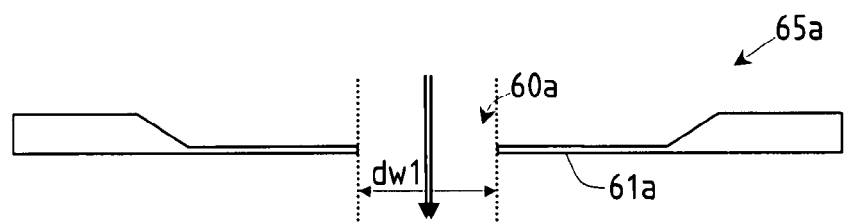
FIG. 6a shows a protective diaphragm with a simple central opening.
Figure 6B:
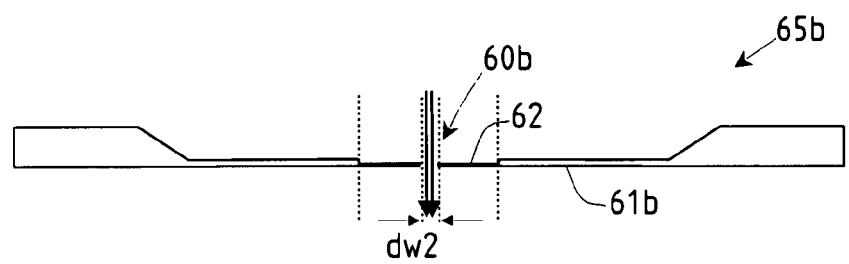
FIG. 6b shows a protective diaphragm with a partially transmissive membrane.
Figure 6C:
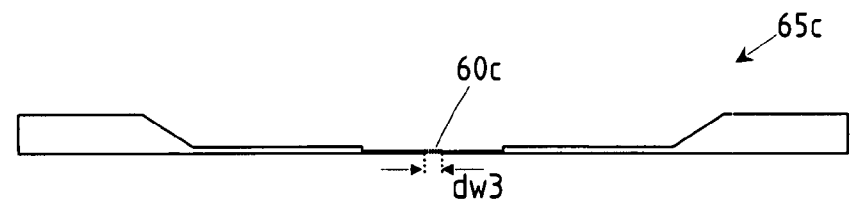
FIG. 6c shows a protective diaphragm with a fragmented central opening.

FIGS. 6a, 6b and 6c show preferred implementations of the protective diaphragm as schematic longitudinal sections. The first variant 65a, shown in FIG. 6a, is a wafer whose inner portion is thinned to form an absorbing membrane 61a of a desired thickness. A central opening 60a of width dw1 allows the passage of the beam.

In order to further improve the reduction of fogging, in particular to avoid low energy particles to reach the substrate after re-scattering, the protective diaphragm can be made in such a way that a partially transmissive membrane is present in the range close around the central opening. FIG. 6b shows a variant 65b with such a partially transmissive membrane 62. In contrast to the first variant, the central opening 60b has a smaller width dw2 but is surrounded by a portion 62 which is even more thinned than the membrane 61b and thus forms a partially transmissive membrane.

In the diaphragm 65b of FIG. 6b, the width dw2 of the central opening can be made smaller as compared to the variant of FIG. 6a, wherein the partially transmissive membrane allows the beam to reach the substrate without touching the membrane. The partially transmissive membrane 62 allows particles coming from the substrate to penetrate the membrane without significant backscattering, which would cause an additional parasitic exposure originating from the membrane. However, particles re-scattered at the lower surface of the objective lens and related contours (and/or from the stages, metrology systems or beam diagnostic deviced located near the beam) which have a kinetic energy below the threshold energy of penetration are absorbed by the partially transmissive membrane. Therefore the partially transmissive membrane 62 helps to further reduce the total particle flow arriving at the substrate by re-scattering processes.

FIG. 6c shows another variant 65c wherein the central aperture is fragmented into an array 60c of apertures. Depending on the geometry of the beamlet array and the mechanical stability of the membrane, each of the apertures may be designed for one (switch-on) beamlet or a group of beamlets. The relevant width dw3 is the overall width of the array 60c. This variant 65c is based on the variant 65b of FIG. 6b, but may be derived from the variant 65 without a partially transmissive membrane as well.

It is worthwhile to note that the central openings 60a,60b, 60c need not necessarily be located in the center of the diaphragm device—in particular, when the diaphragm device is mounted excentric to the optical axis of the lithography system. (The term 'central' refers to the location with regard to the optical axis.)

Figure 7:
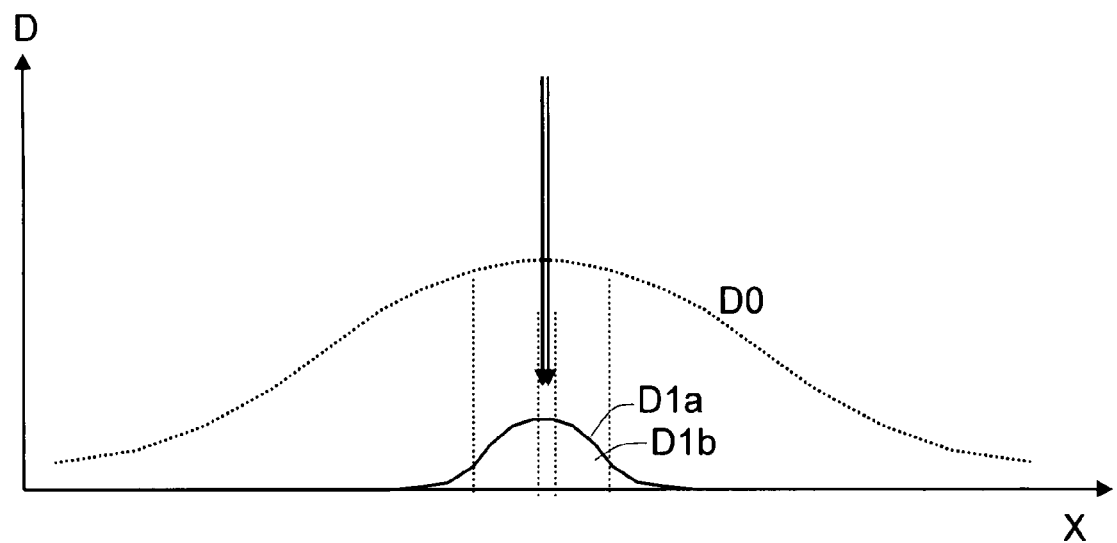
FIG. 7 shows various cases of the intensity distribution due to particle fogging, shown for the cases without the protective diaphragm, with a protective diaphragm of FIG. 9a and with that of FIG. 9b.

FIG. 7 shows three types of dose distribution caused by fogging. The vertical axis represents the dose, the horizontal axis is the lateral displacement where the vertical arrows denote the beam (optical axis); both axes are in arbitrary units. D0 is the background dose which is present without a diaphragm according to the invention. D1a is the background dose with a diaphragm 65a, and D1b is the background dose with a diaphragm 65b having a partially transmissive membrane. The main improvement of the invention with respect to particle fogging is that dose distributions D1a and D1b are convolution functions, i.e., resulting from a convolution of the dose distribution step function due to the opening and a point spreading function given by the instrumental conditions (eg. geometry and structure of the surfaces that lead to particle fogging). In contrast to a Gaussian-type distribution D0, the convolution functions D1a and D1b give rise to a well defined and rapid decrease of the fogging dose from a finite value to zero outside the void region, defined by the opening in the protective diaphragm, as seen from the substrate. The distribution D0, which represents the dose distribution according to the state of the art, displays relevant non-zero values at even centimeter distances from the impinging beam position. As a consequence, the integrated dose, while scanning over the substrate, is a complex function of the pattern density distribution on the substrate, and instrumental conditions (such as anisotropy of the fogging behavior) have to be considered accurately. This means that in the state of the art even neighboring die fields may be significantly influenced by re-scattered particles; a situation which is overcome by the use of a protective diaphragm according to the invention.

Figure 8:
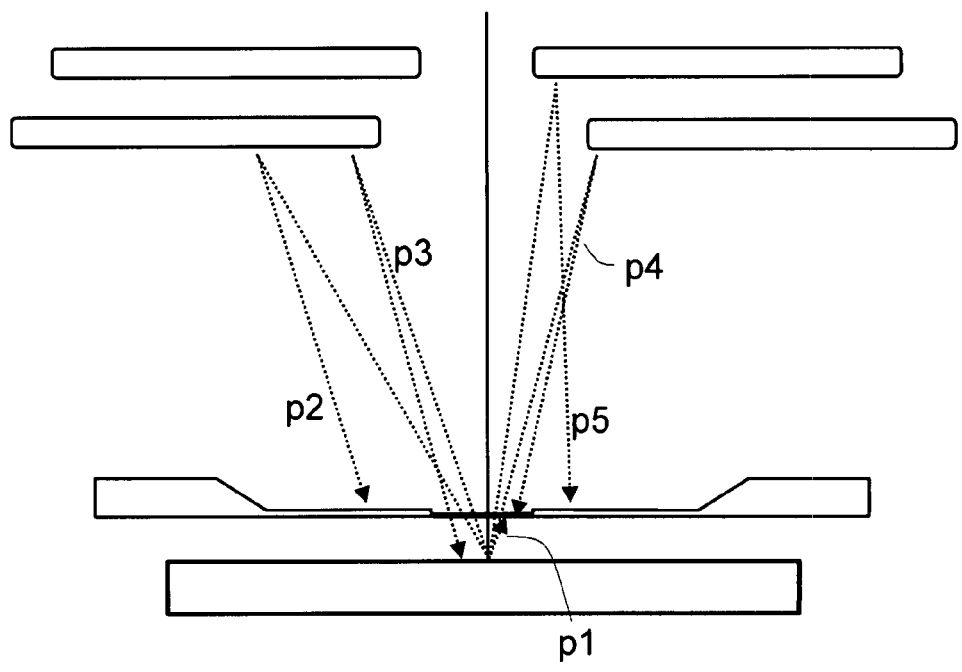
FIG. 8 is a schematic overview of backscattering, by various exemplary trajectories of particles.

FIG. 8 shows various typical ways of backscattering, namely, exemplary trajectories of particles (case of light ions or electrons) backscattered at the substrate, stopped at the absorbing membrane of the protective diaphragm, and penetrating/being absorbed at the partially transmissive membrane of the protective diaphragm. The particle p1 is evaporated or desorbed from the target and stopped at the lower surface of the protective diaphragm, in this case at the partially transmissive membrane. Particle p2 is rescattered from the lower surface of the objective lens electrode and stopped by the absorbing membrane, while particle p3 rescattered as well penetrates the partially transmissive membrane. Particle p4 is rescattered from the lower surface of the objective lens electrode and stopped by the partially transmissive membrane. Finally, particle p5 is rescattered from a lens electrode, but otherwise is the same behaviour as p2.

Geometry of the Protective Diaphragm

With respect to the opening diameter and distances between substrate, protective diaphragm and lower surface of the objective lens it is appropriate to distinguish two cases:

1) Use of Light Ions and Electrons:

In this case the main effect to be controlled are undesired collisions of backscattered particles with critical elements of the optical system and/or contamination of the same due to deposition of material evaporated or outgassing from the substrate. Furthermore, the intensity of particle fogging at the substrate can be largely reduced. The use of an absorbing membrane prevents re-scattered particles and diffuse portions of the beam itself from reaching the substrate outside the region limited by the opening diameter. The use of a partially transmissive membrane in conjunction with the absorbing membrane additionally allows to hinder low energy particles and components that come from the substrate (e.g. by outgassing, desorption) from reaching critical elements of the optical system while energetic particles are not hindered to penetrate the same membrane. The flow of these energetic particles—after being re-scattered from the lower surface of the objective lens—is largely diluted when passing the same absorbing membrane in the opposite direction.

Therefore, it is highly suitable to choose a small distance between the substrate and the protective diaphragm, and a diameter of the opening in the absorbing membrane as large as possible. The opening in the partially transmissive membrane is chosen as small as possible. For example, if the beam diameter is 25 μm and the distance between the last electrode and the substrate is 2 mm (=working distance if no diaphragm is used), the diaphragm 25 may be placed at a position 0.1 mm above the substrate and have an opening diameter dw in the absorbing membrane of about 1 mm and an opening diameter in the partially transmissive membrane of 50-100 μm. The thickness of the absorbing membrane may be 5 to 50 μm, depending on the energy of the beam. For instance, in case of a 100 keV electron beam, the maximum possible energy after re-scattering is 100 keV, and the penetration depth in Si is in the range of 50 μm and slightly above. To reduce the penetration depth it may be useful to use thin membrane coatings with a heavy metal (e.g. Mo, Pt, Au) component, whereas the coating is fabricated on the surface at which the re-scattered particles are to be absorbed (typically, this upper surface is facing to the lower surface of the objective lens). Particles that are emitted from the substrate along the optical axis through the central opening of the protective diaphragm do not give rise to contamination as these particles are stopped by a second diaphragm 16 inside the optical system. The thickness of the partially transmissive membrane may be 100 to 5000 nm, typically smaller than the mean free path of collision, which depends on the atomic weight and particle energy. For instance, for 100 keV electrons the thickness of a partially transmissive membrane made from Si would be about 1000 nm in order to achieve a threshold energy of 5-10 keV for electrons (i.e. virtually all particles are absorbed inside the membrane without penetration). However, the main purpose of the thin membrane is to absorb slow particles coming from the substrate side, such as for example resist outgassing components to avoid contamination of the charged particle optical system.

2) Use of Heavy Ions and Clusters:

For this type of particles the main effect to be controlled by the protective diaphragm is the re-deposition of sputtered material from the substrate, which may contaminate the lens elements of the objective lens or the protective diaphragm itself. Further, the protective diaphragm shall protect the delicate optical elements from damages due to (back)scattered ions from the substrate. The penetration depth for ions is very small, typically 10-50 nm, for the energy regime of interest. Therefore, for heavy ions and clusters the main purpose of the protective diaphragm is to reduce to view angle as seen from the substrate towards the objective lens as much as possible. For this the distance between the substrate and the protective diaphragm is chosen as high as possible (thus diluting the flow of (back)scattered ions which has a positive influence on the life time of the diaphragm), and the diameter of the opening in the protective diaphragm as small as possible. If, for example, the beam diameter is 25 μm and the distance between the last electrode and the substrate is 2 mm (using the working distance as in the case of no diaphragm), the diaphragm may be placed at 1.5 mm above the substrate and have an opening diameter of about 50-100 μm. The thickness of the absorbing membrane may be 5-50 μm. With the described dimensions the same protective diaphragm 25 (of the type 75 as shown in FIG. 9a) has the function of an effective protection against particle fogging if the chemical element used for the protective diaphragm has a much smaller atomic weight than the projectiles, in which case re-scattering of particles is impossible due to momentum conservation. Scattered or sputtered particles that are emitted along the optical axis through the small opening in the protective diaphragm do not give rise to re-scattering as the distance between the protective diaphragm and the plate by which the particles are finally stopped/backscatterd at least an order of magnitude larger, at least greater than 1 mm.

The opening diameter dw in the Protective Diaphragm is typically much smaller than the width ew of the opening in the final electrode, preferably by a factor of 10. A typical value of the distance may be 1 mm, thus limiting the view angle $2\alpha=dw/zd$ for an image field fw of 25 μm to 50-125 mrad. It is important to note that the Protective Diaphragm 15 is not a contact mask since it does not define the shape of the beam spot formed on the target!

The use of a protective diaphragm as described by the invention brings about a significant reduction of the total amount of fogging related dose by at least a factor of 5 (depending on the ratio of the opening in the protective diaphragm and the effective area of re-scattering). Moreover, it limits the lateral range of the background intensity caused by fogging to the size of the opening in the absorbing membrane of the protective diaphragm.

The optimal size of the opening in the absorbing membrane of the protective diaphragm will depend on the distance of the membrane from the substrate. Assuming a cosine distribution of the angle of emitted particles with regard to the axis of incidence of the impingement particle, the ratio of width dw and distance zd (cf. FIG. 4) may be typically 10:1, which means that backscattered particles in an angular region 0°-85° (where 0° means parallel to surface normal) contribute to re-scattering from the lower surface of the objective lens and related contours, and only the angular region of 85°-90° leads to re-scattering from the membrane in proximity to the substrate, which is 0.5% of the total backscattered particles.

Obviously, structure and composition of the lower surface of the objective lens and related contours will be chosen such that a large fraction of the re-scattered particles has a kinetic energy below the threshold energy. This can be achieved by measures such as choosing a light material with low density (e.g. porous material) which allows a deep penetration, so as to increase the probability of multiple collisions.

The partially transmissive membrane may be made of a light element material such as silicon or diamond carbon. The thickness of the membrane may be typically 100 to 5000 µm, depending on the energy and mass of charged particle projectiles. Therefore, virtually all backscattered electrons will pass the partially transmissive membrane on their way from the substrate to the lower surface of the objective lens and related contours. The re-scattered electrons are distributed over a large area and have a broad energy distribution, of which only the electrons inside the opening of the protective diaphragm will give rise to fogging, whereas energies below a threshold energy will be fully suppressed by the membrane.

The Protective Diaphragm 15 is specifically designed to avoid damaging of delicate regions such as electrostatic lens contours exposed to high electrical field strengths or requiring precise shape stability in the micrometer range and below.

As already mentioned, the Protective Diaphragm 15 is positioned in between the optical column 103 and the substrate 41, without presence of electrostatic or magnetic fields as used for the imaging system. Therefore, the particles penetrating the Protective Diaphragm are not deflected. However, small potentials might be applied (range <30V) to prevent secondary electrons to leave the Diaphragm. Secondary electrons may be generated on both upside and downside surfaces by back-scattering or "fogging" (i.e., particles which have lost the desired direction due to scattering with residual gas atoms or are re-scattered by the lower surface of the objective lens or related contours).

During the exposure process of a substrate, the substrate is patterned by moving the substrate so as to obtain a relative movement of the beam over the area to be patterned, whereas the position of the substrate is measured by a metrology system and the deviation of the position thus measured from the nominal position (ideal position) is compensated by a beam tracking control system, for which a beam placement correction is applied by means of multi-poles deflectors. The patterned beam, however, remains substantially static with respect to the particle-optical system. In this context, it is worthwhile to note that a (lateral) beam placement correction requires no significant beam placement shift at the position of the Protective Diaphragm because of the precision of the scanning stages, which in the case of the present embodiment is in the low micrometer range (5-20 µm).

Forming of the Aperture in the Protective Diaphragm

Figure 3:
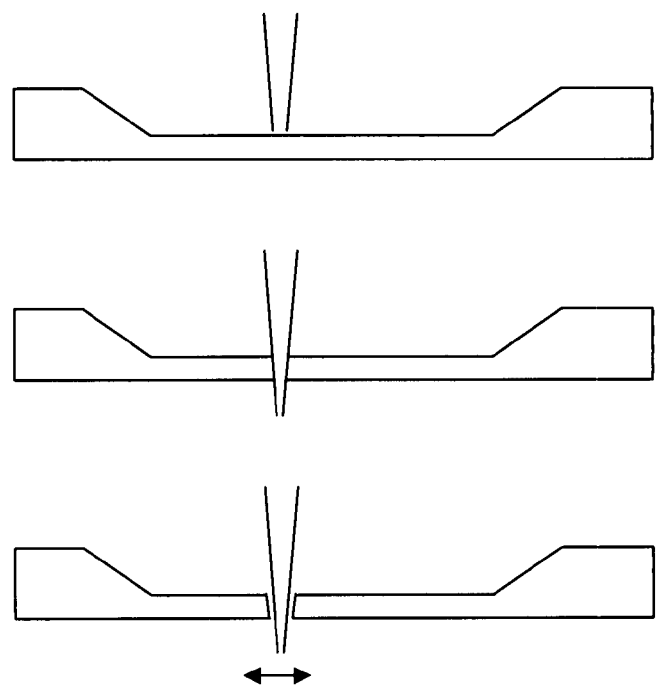
FIG. 3 illustrates a self-definition process for the forming of the aperture in the protective diaphragm.

By virtue of the invention, the Protective Diaphragm may be patterned by the beam itself by a procedure that may be called a "self controlled definition procedure". For definition and fabrication of the diaphragm aperture, in particular shape, diameter and position of the aperture with respect to the optical axis, the following procedure as illustrated in FIG. 3 is convenient: A thin membrane (like of the type discussed with FIGS. 9a and 9b) is positioned at the desired distance from the substrate position in between the optics and the prospective substrate position, using a mount which is stable with respect to lateral drifts, as for example by friction springs that produce an appropriate pressure between the membrane frame and the holder support structure. By switching on the beam, at first the membrane stops the beam (upper part of FIG. 3), until the beam has etched or sputtered through the membrane (middle of FIG. 3). Controlled shifting of the beam envelope by a small range in lateral direction, typically 2-3 time the expected scanning range necessary to track the moving substrate, helps to achieve the desired diameter of the aperture through the membrane (lower part of FIG. 3), so the beam will, in all cases, have a distance of at least the thickness of the membrane from the membrane side walls during operation (otherwise, scattering and sputtering would reduce image quality). At the end of the process, when the beam has propagated through the complete set of directions, the beam envelope does not hit the membrane as seen from the direction of the source.

The self controlled definition procedure allows a replacement of the Protective Diaphragm, as a consumable part, in the system without great mechanical effort, as it involves only a replacement of the whole membrane structure, without re-adjustment of the lateral position. Notably, it is possible to "reuse" the membrane by shifting the membrane by a sufficiently large lateral shift and then fabricate an new opening once the old opening has been degraded by the beam and its secondary particles. In this case, the protective diaphragm may also be pre-structured as an array of apertures of width dw.

Segregated Target Space

Figure 4:
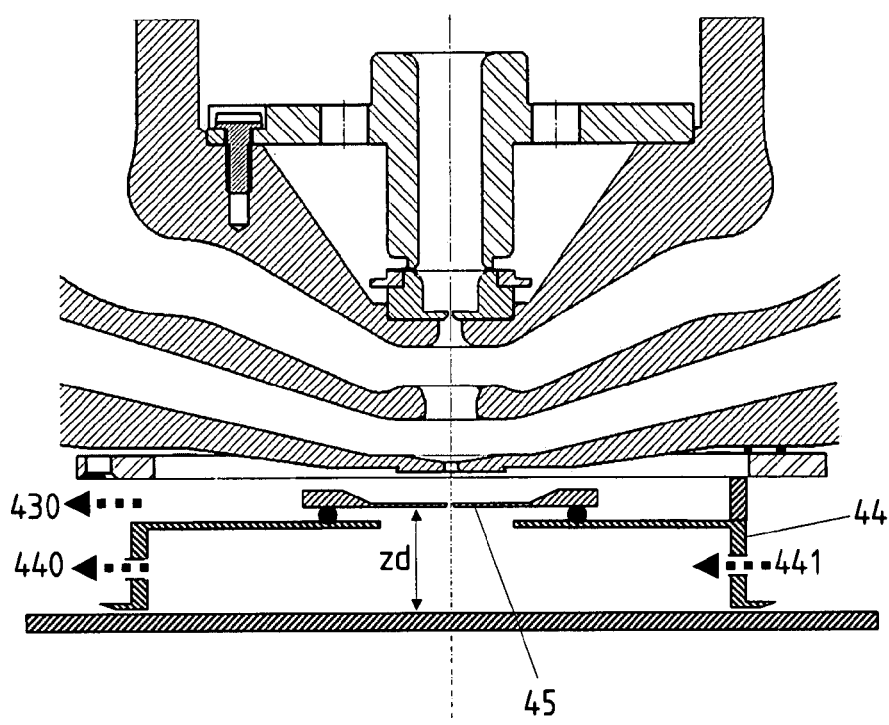
FIG. 4 shows a protective diaphragm of a second embodiment with a segregated target space.

Referring to FIG. 4, the Protective Diaphragm may, in conjunction with other elements, serve to separate the vacuum space between the optical column (pumped, e.g., by an own pumping line 430) and that of the substrate, whereas differential pumping effectively reduces the partial pressure of the process gases inside the optical column. A target space housing 44 incorporating the Protective Diaphragm 45 as a central part may be provided not only with pumping lines 440, but also with gas feeding lines 441 for processing gases or the like. In FIG. 4 the gas inlet 441 is realized as an inlet tube, giving rise to a generally improved homogeneity inside the reactor chamber.

By virtue of the target space housing the target space may be realized as a reactor chamber. The substrate and the scanning system may be located entirely within the chamber (not shown), or the reactive chamber covers only part of the substrate and is vacuum-sealed with respect to the substrate as shown in FIG. 1. For large substrates, such as wafers or mask blanks, it is advantageous to seal the reactive chamber with respect to the substrate, e.g. by a small slit in between the reactor chamber and the substrate (for example the diameter 1 mm, the distance 5 µm, the distance controlled by a capacitive or optical distance detector and vertical actuator system with feedback loop.

Figure 5:
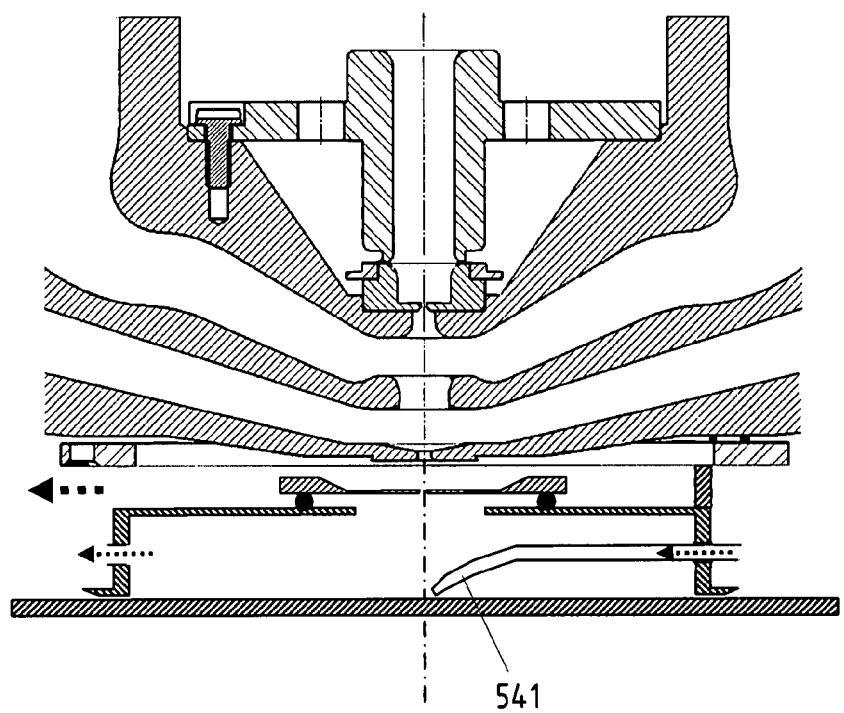
FIG. 5 shows a third embodiment with an additional processing gas inlet.

In a variant shown in FIG. 5, the gas inlets may also be realized as gas nozzles 541. Such a gas nozzle system allows to employ gas assisted chemical processes, typically used to enable or enhance beam induced processes.

Inner Stopping Diaphragm

Preferably, as shown in FIGS. 1 and 2, a second diaphragm 16, 26 may be provided as an "inner stopping diaphragm" (ISD) within the optical projection system 33 in order to further improve the protective effect of the Protective Diaphragm 15. As already mentioned, the Protective Diaphragm 15 is positioned in between the last optical lens element and the substrate in an suitable way to limit the view angle $2\alpha$ in such a way that all particles emitted by the beam (by processes such as scattering or desorption) at the position of the substrate, moving in the negative direction of the optical column (upwards in the figure), reach only a limited area in the column. Now, this area may be equipped with an ISD 16, 26 positioned at or near the crossover c2 of the final projector stage. In FIG. 1, the ISD 16 is shown as a flat device punctured in the center, whereas its actual shaping may be different, such as a cup-like shape 26 shown in FIG. 2. Note that also the ring aperture 17, 27, which geometrically surrounds the crossover c2, may have a more complex shape than a simple flat plate with a central hole (the ring aperture 17, 27 serves to block out beam parts not converging through the crossover position, most notably the switched-off beamlets). Generally, the speed of contamination of the ISD is rather small because of the large distance from the substrate (since the beam diameter is small, the intensity of particles emitted from the substrate decreases with the square of the distance).

The ISD is suitably also a replaceable device. The ISD 26 can be cleaned and serviced in order to avoid system break down by contamination, meaning any chemical, physical, structural or topographical alteration of the respective surface.

The distance between the pattern definition device 102 with its most delicate structures and the substrate 41 is generally large for large reduction optical systems as considered in the present invention, typically at least 20 times larger than the distance zd between the Protective Diaphragm and the substrate. Therefore, the intensity of the contaminating particle flow which penetrates even the ISD 16 through its central opening, eventually reaching the pattern definition device, is significantly reduced to a negligible value ($1/20^2$, well below a percent).

In a preferred embodiment the ISD 16 and the absorbing plate is realized as one single device (the absorbing plate being formed by the upper part of the ISD 16) which can be changed during regular cycle intervals.

The surface of the Protective Diaphragm which is oriented towards the substrate may be also used as a secondary electron detector in conjunction with a current detection system, as shown in FIG. 3. For this purpose the surface may be structured by Semiconductor Technology in such a way that angular segments of detector electrodes in an arbitrary 2D arrangement (see figure below) are produced, for example to allow angular resolution of the secondary electron emission. Interconnection between these detector electrodes and contact pads allow individual pre-amplifiers for each signal, whereas the signal lines along the membrane are shielded by a metallic layer underneath.

Multi-Beam Device

Figure 9:
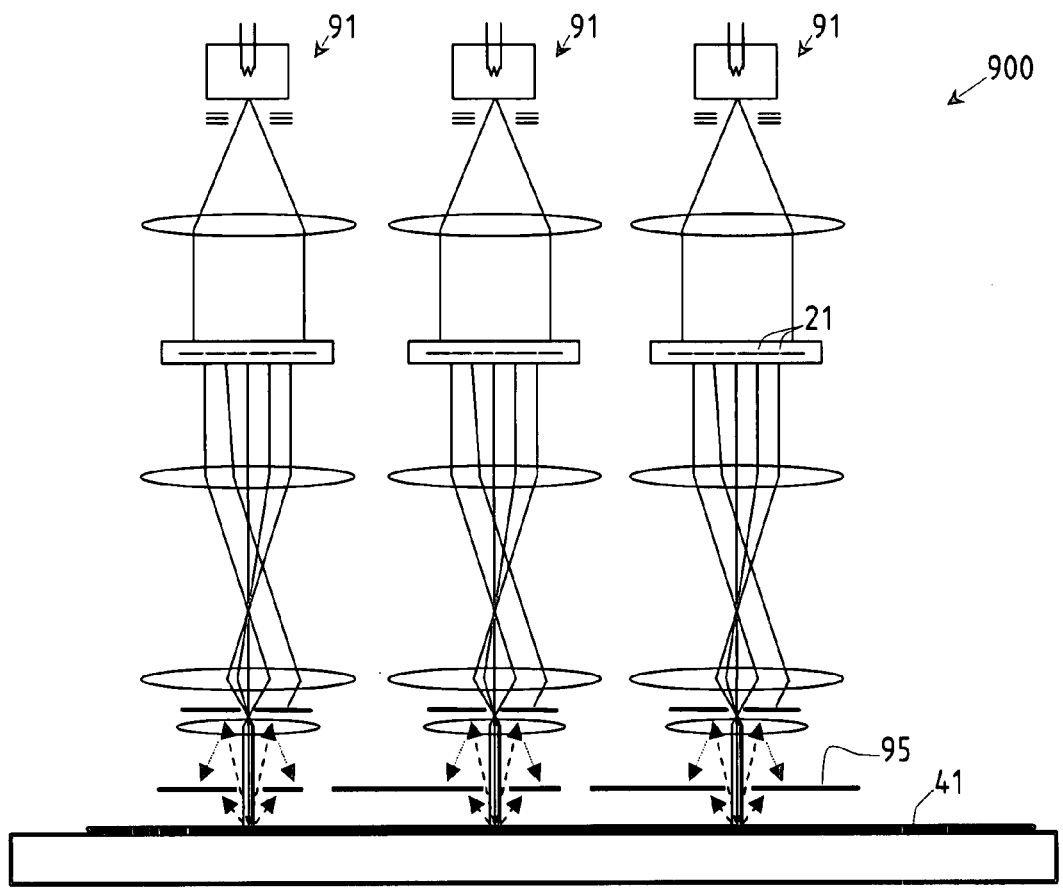
FIG. 9 shows a schematic overview of a multi-beam exposure apparatus incorporating a common protective diaphragm.

FIG. 9 shows the invention in the context of a multi-beam apparatus 900 like the type as disclosed in US2005-0104013-A1 of the applicant (assignee). In FIG. 9, three columns 91 are shown which are positioned in a parallel or side-by-side arrangement and are designed to process on the target 41 simultaneously; the number of columns 91 may vary according to the individual appliance. The columns are provided with a common protective diaphragm means 95 which has a number of central openings; more specifically, one central opening 90 is provided for each of the columns. In other respects, the components of each of the columns 91 correspond to those of the apparatus 100 of FIG. 1.

Figure 10:
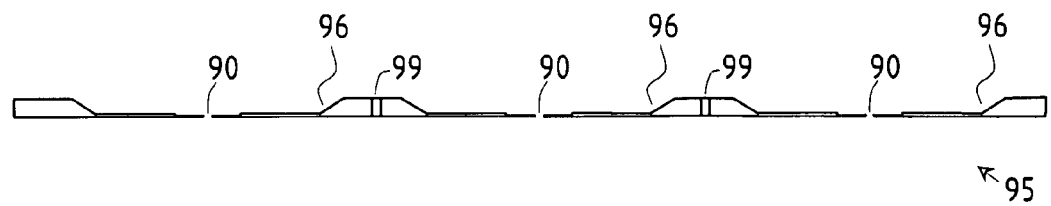
FIG. 10 shows a sectional detail of the protective diaphragm of FIG. 9.

FIG. 10 shows one possible implementation of this protective diaphragm means 95, namely, composed of a number of wafers 96 joined at their sides (for this, the shape of the wafers may have to be cut in a suitable manner). The wafers 96 are, for instance, of the type shown in FIG. 6b, but may be realized in any other way suitable for a protective diaphragm according to the invention. Beside the central openings 90, additional openings 99 may be provided for specific purposes such as pumping lines or metrology systems.

We claim:

1. A particle-beam projection processing apparatus for irradiating a target by means of a patterned beam of energetic electrically charged particles, comprising an illumination system for generating and forming said energetic particles into an illuminating beam which is substantially tele/homocentric and whose diameter is greater by at least one order of magnitude than the length of the tele/homocentricity region of the illuminating beam, a pattern definition assembly located after the illumination system as seen along the direction of the beam, said pattern definition assembly being adapted to position an aperture pattern composed of apertures transparent to the energetic particles in the path of the illuminating beam, thus forming a patterned beam emerging from the aperture pattern, a projection system positioned after the pattern definition assembly and comprising a number of optical elements for shaping an electrical or electromagnetic field into at least one particle-optical lens, each of said optical elements having a central opening surrounding the path of the patterned beam, the projection system being adapted to form a final image of the aperture pattern, said final image being located within a field-free space after the projection system, and a target stage located after the projection system and adapted to position a target at the position of a final image formed by the projection system, the target being the first object to obstruct the path of the patterned beam after the last optical element of the projection system, further comprising a first diaphragm located between the projection system and the target stage and having a central aperture surrounding the path of the patterned beam, wherein at least the portions of the first diaphragm defining the central aperture are located within said field-free space.

2. The apparatus of claim 1, wherein the central aperture is adapted to laterally delimit the patterned beam.

3. The apparatus of claim 1, wherein the aperture of the first diaphragm has a width at least five times smaller than the width of the central opening of the last optical element of the projection system.

4. The apparatus of claim 1, wherein the projection system comprises a second diaphragm having a central aperture surrounding the patterned beam and being positioned at a location before an optical element of the projection system, the central aperture of said second diaphragm having a width smaller than the width of the central opening of said optical element.

5. The apparatus of claim 4, wherein the projection system is adapted to project the patterned beam through a cross-over, and the second diaphragm surrounds the patterned beam at or close to the position of said cross-over.

6. The apparatus of claim 1, wherein the first diaphragm is a component of a housing means adapted to define a space around a location where the beam impinges upon the target and separate said space from the surrounding space, said housing means further comprising a pumping line for evacuation of said space.

7. The apparatus of claim 6, wherein the housing means further comprises a gas inlet nozzle for directing gas towards the location where the beam impinges upon the target.

8. The apparatus of claim 1, wherein the projection system comprises a number of electro-optical elements for shaping an electrical field into an electro-optical lens.

9. The apparatus of claim 1, wherein the first diaphragm is adapted to be mounted at various positions differing only by lateral shifts perpendicular to the direction of the beam.

10. The apparatus of claim 1, wherein the central aperture is composed of a multitude of apertures arranged in an array, the width of the central aperture being constituted by the total width of said array.

11. The apparatus of claim 1, wherein the central aperture is surrounded by a membrane portion of a thickness not greater than the width of the central aperture.

12. The apparatus of claim 11, wherein the membrane portion is transparent for impinging particles having a kinetic energy smaller than a threshold energy below the kinetic energy of the particles of the beam when they are passing through the central aperture.

13. The apparatus of claim 1, wherein the width of the central opening of the last optical element of the projection system is smaller than one quarter of the distance of said last optical element to the final image.

14. A multi-beam projection processing apparatus comprising a number of particle-beam apparatuses according to claim 1 arranged in a side-by-side manner, said apparatus having a diaphragm means having a number of central openings, wherein each central opening together with a surrounding region of the diaphragm means realizes the first diaphragm of a respective particle-beam apparatus.

* * * * *